United States Patent
Takezono et al.

(10) Patent No.: US 12,244,276 B2
(45) Date of Patent: Mar. 4, 2025

(54) POWER AMPLIFIER CIRCUIT

(71) Applicant: Murata Manufacturing Co., Ltd., Kyoto (JP)

(72) Inventors: Naofumi Takezono, Kyoto (JP); Masashi Maruyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 546 days.

(21) Appl. No.: 17/656,284

(22) Filed: Mar. 24, 2022

(65) Prior Publication Data
US 2022/0311394 A1   Sep. 29, 2022

(30) Foreign Application Priority Data
Mar. 26, 2021   (JP) ................. 2021-053332

(51) Int. Cl.
*H03F 1/30* (2006.01)
*H03F 3/24* (2006.01)

(52) U.S. Cl.
CPC ....... *H03F 3/245* (2013.01); *H03F 2200/451* (2013.01)

(58) Field of Classification Search
CPC .............. H03F 1/30; H03F 3/20; H03G 3/30
USPC ............................................. 330/296, 285
See application file for complete search history.

(56) References Cited

U.S. PATENT DOCUMENTS

| | | | | |
|---|---|---|---|---|
| 7,345,547 B2 * | 3/2008 | Wang | ...................... | H03F 3/605 330/296 |
| 8,692,619 B2 * | 4/2014 | Wakita | .................... | H03F 1/302 330/296 |
| 8,963,643 B2 * | 2/2015 | Lautzenhiser | ....... | H03G 3/3036 330/296 |
| 2009/0212863 A1 | 8/2009 | Ishimaru | | |

FOREIGN PATENT DOCUMENTS

JP   2009-200770 A   9/2009

* cited by examiner

*Primary Examiner* — Henry Choe
(74) *Attorney, Agent, or Firm* — McDonald Hopkins LLC

(57) ABSTRACT

A power amplifier circuit includes an amplifier transistor that amplifies a radio-frequency signal and outputs the radio-frequency signal, and a bias circuit that supplies a bias current to a base of the amplifier transistor. The bias circuit includes a bias current supply transistor, and an electrostatic capacity circuit whose electrostatic capacity varies in accordance with a temperature of the amplifier transistor and that is charged in a non-supply period during which the bias current is not supplied and discharges to a supply path for the bias current in a supply period during which the bias current is supplied. The supply period during which the bias current is supplied includes an amplification period during which the radio-frequency signal is amplified by the amplifier transistor. The bias current starts to be supplied before the amplifier transistor starts amplification.

13 Claims, 13 Drawing Sheets

POWER AMPLIFIER CIRCUIT

CROSS REFERENCE TO RELATED APPLICATION

This application claims priority from Japanese Patent Application No. 2021-053332 filed on Mar. 26, 2021. The content of this application is incorporated herein by reference in its entirety.

BACKGROUND ART

The present disclosure relates to a power amplifier circuit.

In recent years, time division duplex (TDD) has been used in most cases to secure channels along with a transition to the fifth generation mobile communication system. Furthermore, the issue of improving the modulation accuracy (error vector magnitude (EVM)) of a transmission signal to increase a communication rate is faced.

When power amplification is started, as a transistor for power amplification generates heat, the hFE of the transistor for power amplification varies. Japanese Unexamined Patent Application Publication No. 2009-200770 discloses a technique in which, when power amplification is started, a bias to be supplied to a transistor for power amplification is transiently increased to transiently increase a power amplification factor of the transistor for power amplification.

BRIEF SUMMARY

In a power amplifier circuit disclosed in Japanese Unexamined Patent Application Publication No. 2009-200770, the dependence of the hFE of the transistor for power amplification on temperature is not considered. Thus, there is a possibility that the full effect of an improvement in EVM is not obtained in some environmental temperatures.

In view of the above, the present disclosure has been made to implement a power amplifier circuit that enables an effective improvement in modulation accuracy.

A power amplifier circuit according to one aspect of the present disclosure includes an amplifier transistor configured to amplify a radio-frequency signal and output the radio-frequency signal, and a bias circuit configured to supply a bias current to a base of the amplifier transistor. The bias circuit includes a bias current supply transistor, and an electrostatic capacity circuit whose electrostatic capacity varies in accordance with a temperature of the amplifier transistor and that is configured to be charged in a non-supply period during which the bias current is not supplied and is configured to discharge to a supply path for the bias current in a supply period during which the bias current is supplied. The supply period during which the bias current is supplied includes an amplification period during which the radio-frequency signal is amplified by the amplifier transistor. The bias current starts to be supplied before the amplifier transistor starts amplification.

A power amplifier circuit according to one aspect of the present disclosure includes an amplifier transistor configured to amplify a radio-frequency signal and output the radio-frequency signal, and a bias circuit configured to supply a bias current to a base of the amplifier transistor. The bias circuit includes a bias current supply transistor, a temperature compensation diode connected in series between a base of the bias current supply transistor and a reference potential, and a first thermistor whose resistance value varies in accordance with a temperature of the amplifier transistor and that is connected in series with the temperature compensation diode. A supply period during which the bias current is supplied includes an amplification period during which the radio-frequency signal is amplified by the amplifier transistor. The bias current starts to be supplied before the amplifier transistor starts amplification.

The present disclosure can implement the power amplifier circuit that enables an effective improvement in modulation accuracy.

DETAILED DESCRIPTION

Power amplifier circuits according to embodiments will be described in detail below with reference to the drawings. Incidentally, these embodiments are not intended to limit the present disclosure. Each embodiment is illustrative and it goes without necessarily saying that configurations described in different embodiments can be partially replaced or combined. In Embodiment 2 and subsequent embodiments, a description of things in common with Embodiment 1 is omitted, and only respects in which Embodiment 2 and the subsequent embodiments differ from Embodiment 1 will be described. In particular, similar function effects achieved by similar configurations are not described one by one in each embodiment.

Embodiment 1

Figure 1:
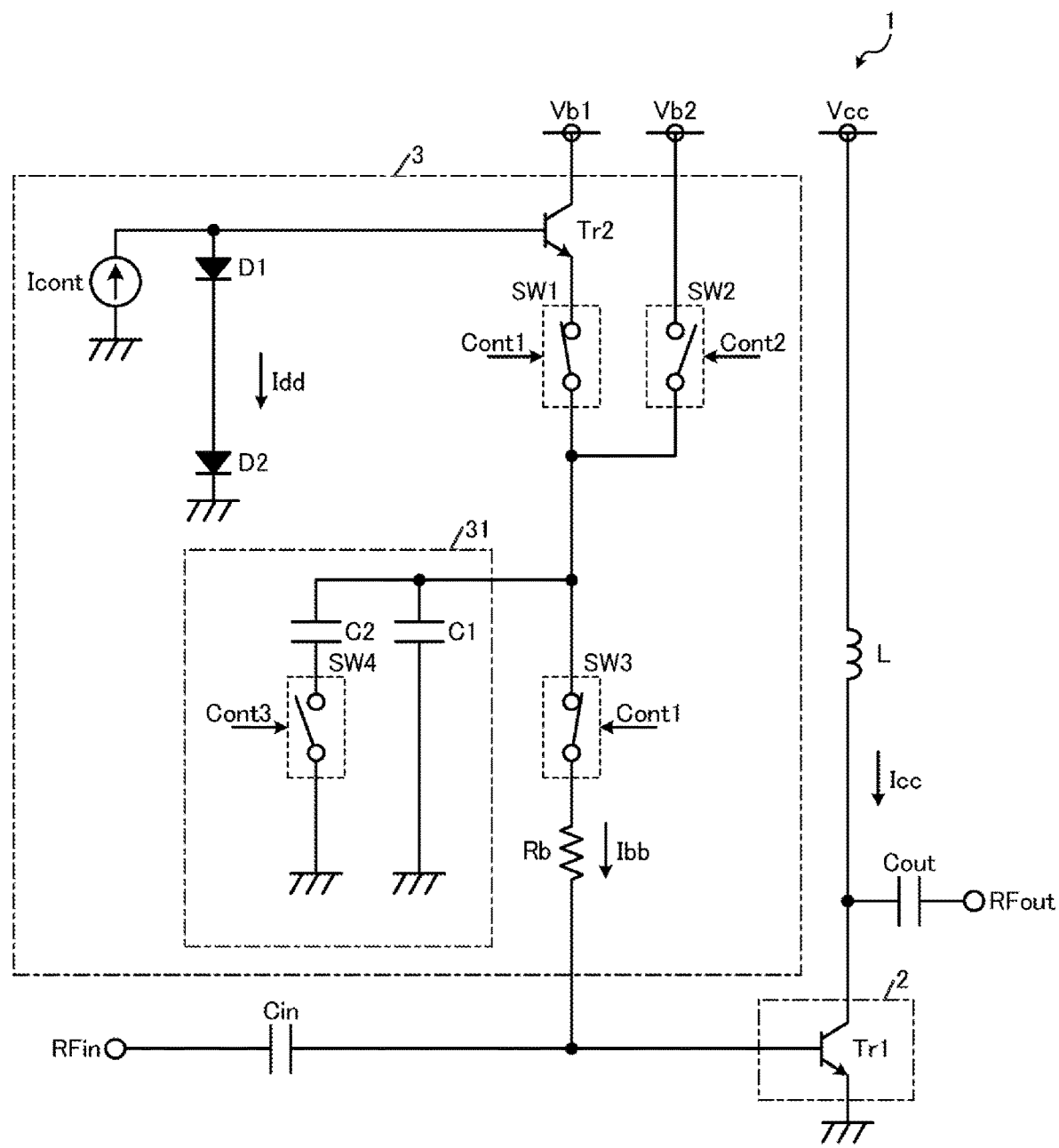
FIG. 1 illustrates an example of a configuration of a power amplifier circuit according to Embodiment 1.

FIG. 1 illustrates an example of a configuration of a power amplifier circuit according to Embodiment 1. A power amplifier circuit 1 can be used in a mobile communication terminal device, such as a cellular phone or smartphone, to transmit various signals, such as voice and data, to a base station.

The power amplifier circuit 1 amplifies, in accordance with a communication system supported by the mobile communication terminal device, radio-frequency signals in a transmission frequency band having a predetermined band width including one or two or more bands (multiple bands). As examples of the communication system, there are the third generation mobile communication system (3G) and the fourth generation mobile communication system (4G). Examples of a transmission frequency band to be amplified by the power amplifier circuit 1 include 2 GHz band (HB) for 3G/4G, specifically, band "1" (B1: transmission frequency band of 1920 to 1980 MHz), band "2" (B2: transmission frequency band of 1850 to 1910 MHz), band "3" (B3: transmission frequency band of 1710 to 1785 MHz), and band "4" (B4: transmission frequency band of 1710 to 1755 MHz). Further examples are band "34" (B34: transmission frequency band of 2010 to 2025 MHz) and band "39" (B39: transmission frequency band of 1880 to 1920 MHz) that are used in a TDD communication system, bands "n40" and "n41" (HB: transmission frequency band of 2.3 to 2.7 GHz), and bands "n77", "n78", and "n79" (UHB: transmission frequency band of 3.3 to 5.0 GHz). Incidentally, the above-described transmission frequency bands are examples, and transmission frequency bands to be amplified by the power amplifier circuit 1 are not limited to these transmission frequency bands.

An input signal RFin, which is a radio-frequency signal in a transmission frequency band, is input from a preceding circuit to the power amplifier circuit 1, and the power amplifier circuit 1 amplifies the input signal RFin having been input. Then, the power amplifier circuit 1 outputs an output signal RFout, which is the amplified radio-frequency signal, to a subsequent circuit. Although an example of the preceding circuit is a transmission power control circuit that adjusts power of a modulated signal, the preceding circuit is not limited to this. Although an example of the subsequent circuit is a front-end circuit that subjects the output signal RFout to filtering and so forth and transmits the output signal RFout to an antenna, the subsequent circuit is not limited to this.

As illustrated in FIG. 1, the power amplifier circuit 1 includes an amplifier 2, a bias circuit 3, an input coupling capacitor Cin, an output coupling capacitor Cout, and a choke inductor L.

The amplifier 2 amplifies the input signal RFin input from the preceding circuit through the input coupling capacitor Cin and outputs the amplified output signal RFout to the subsequent circuit through the output coupling capacitor Cout. The input coupling capacitor Cin blocks a direct-current component between the preceding circuit and the amplifier 2. The output coupling capacitor Cout blocks a direct-current component between the amplifier 2 and the subsequent circuit.

The amplifier 2 includes an amplifier transistor Tr1. Although an example of the amplifier transistor Tr1 is a heterojunction bipolar transistor (HBT), the amplifier transistor Tr1 is not limited to this.

An emitter of the amplifier transistor Tr1 is connected to a reference potential. A base of the amplifier transistor Tr1 is connected to one end of the input coupling capacitor Cin. The input signal RFin is input from the preceding circuit to the other end of the input coupling capacitor Cin. A collector of the amplifier transistor Tr1 is connected to one end of the output coupling capacitor Cout. The output signal RFout is output from the other end of the output coupling capacitor Cout to the subsequent circuit. Furthermore, a power supply potential Vcc is applied to the collector of the amplifier transistor Tr1 through the choke inductor L, so that direct-current power is supplied. Although the reference potential is a ground potential here, the reference potential is not limited to this.

The choke inductor L has a sufficiently high impedance for the transmission frequency band.

The bias circuit 3 includes a first diode D1 and a second diode D2 that are for temperature compensation, and a bias current supply transistor Tr2. Although an example of the bias current supply transistor Tr2 is a heterojunction bipolar transistor (HBT) like the amplifier transistor Tr1, the bias current supply transistor Tr2 is not limited to this.

A cathode of the second diode D2 is connected to the reference potential. A cathode of the first diode D1 is connected to an anode of the second diode D2. An anode of the first diode D1 is connected to a base of the bias current supply transistor Tr2.

A bias control current Icont is supplied from a current source to a connection point between the anode of the first diode D1 and the base of the bias current supply transistor Tr2. When a current Idd flows through a series circuit including the first diode D1 and the second diode D2, a voltage corresponding to a voltage drop across the first diode D1 and the second diode D2 is applied to the base of the bias current supply transistor Tr2. Incidentally, the first diode D1 and the second diode D2 may be implemented by diode-connected transistors in which collectors and bases of the respective transistors are connected.

A first bias power supply potential Vb1 is supplied to a collector of the bias current supply transistor Tr2. An emitter of the bias current supply transistor Tr2 is connected to the base of the amplifier transistor Tr1 through a first switch circuit SW1, a third switch circuit SW3, and a resistor Rb.

The bias current supply transistor Tr2 operates as an emitter follower circuit. A bias current Ibb is supplied to the base of the amplifier transistor Tr1 through the resistor Rb. The input signal RFin is amplified in accordance with the bias current Ibb, and the output signal RFout is output.

Furthermore, in this embodiment, in the bias circuit 3, an electrostatic capacity circuit 31 is provided between a connection point of the first switch circuit SW1 and the third switch circuit SW3 that serve as a supply path for the bias current Ibb and the reference potential (ground potential here). In the electrostatic capacity circuit 31, a first capacitor C1 and a second capacitor C2 are connected in parallel. The second capacitor C2 is provided so as to be able to be disconnected by a fourth switch circuit SW4. An example of a capacitance value of the first capacitor C1 is about 1 µF, and an example of a capacitance value of the second capacitor C2 is about from 1 µF to 2 µF.

Furthermore, in this embodiment, in the bias circuit 3, a second switch circuit SW2 that enables supply of a second bias power supply potential Vb2 is provided at the connection point between the first switch circuit SW1 and the third switch circuit SW3.

Figure 2:
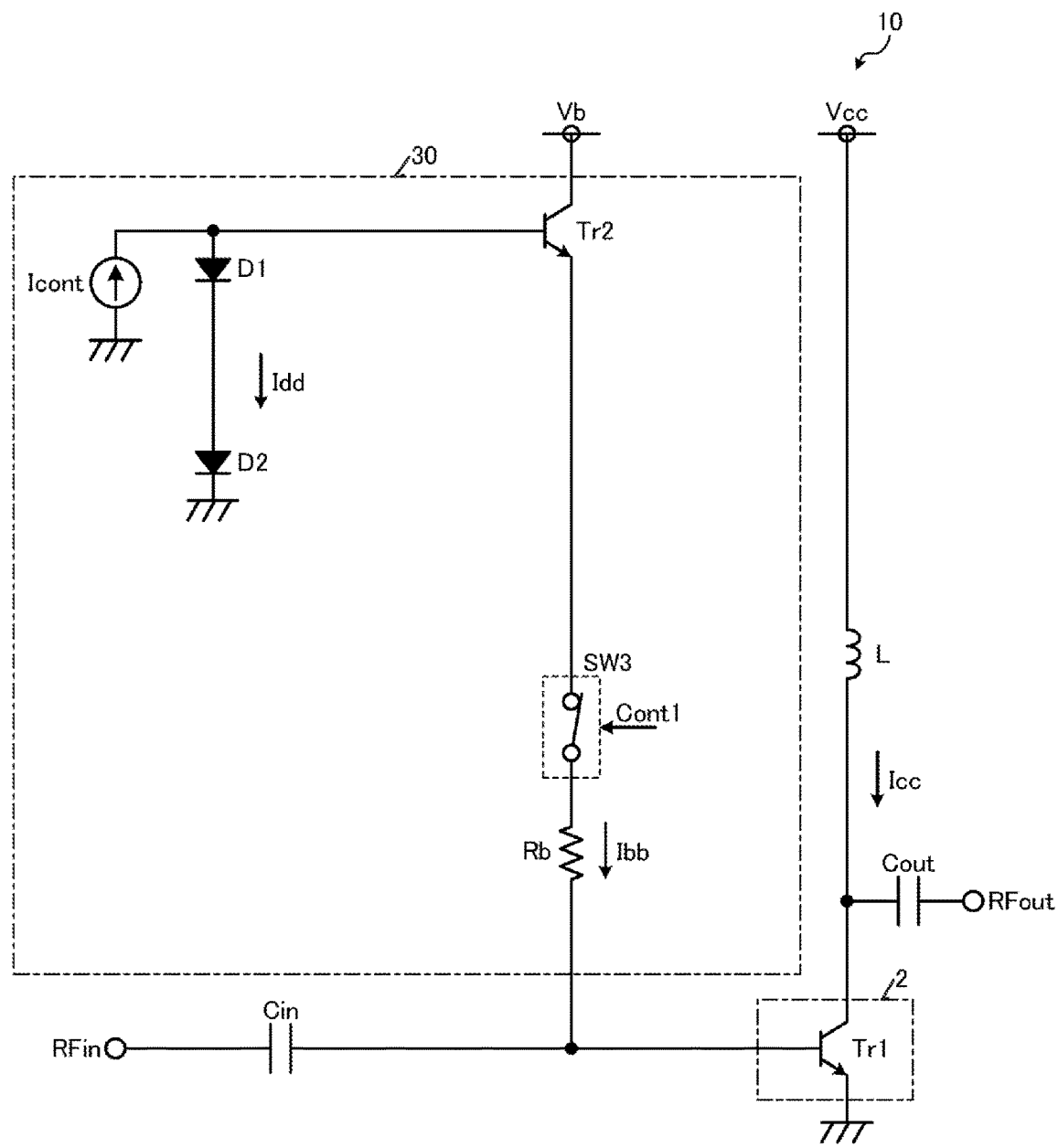
FIG. 2 illustrates an example of a configuration of a power amplifier circuit according to a comparative example.
Figure 3A:
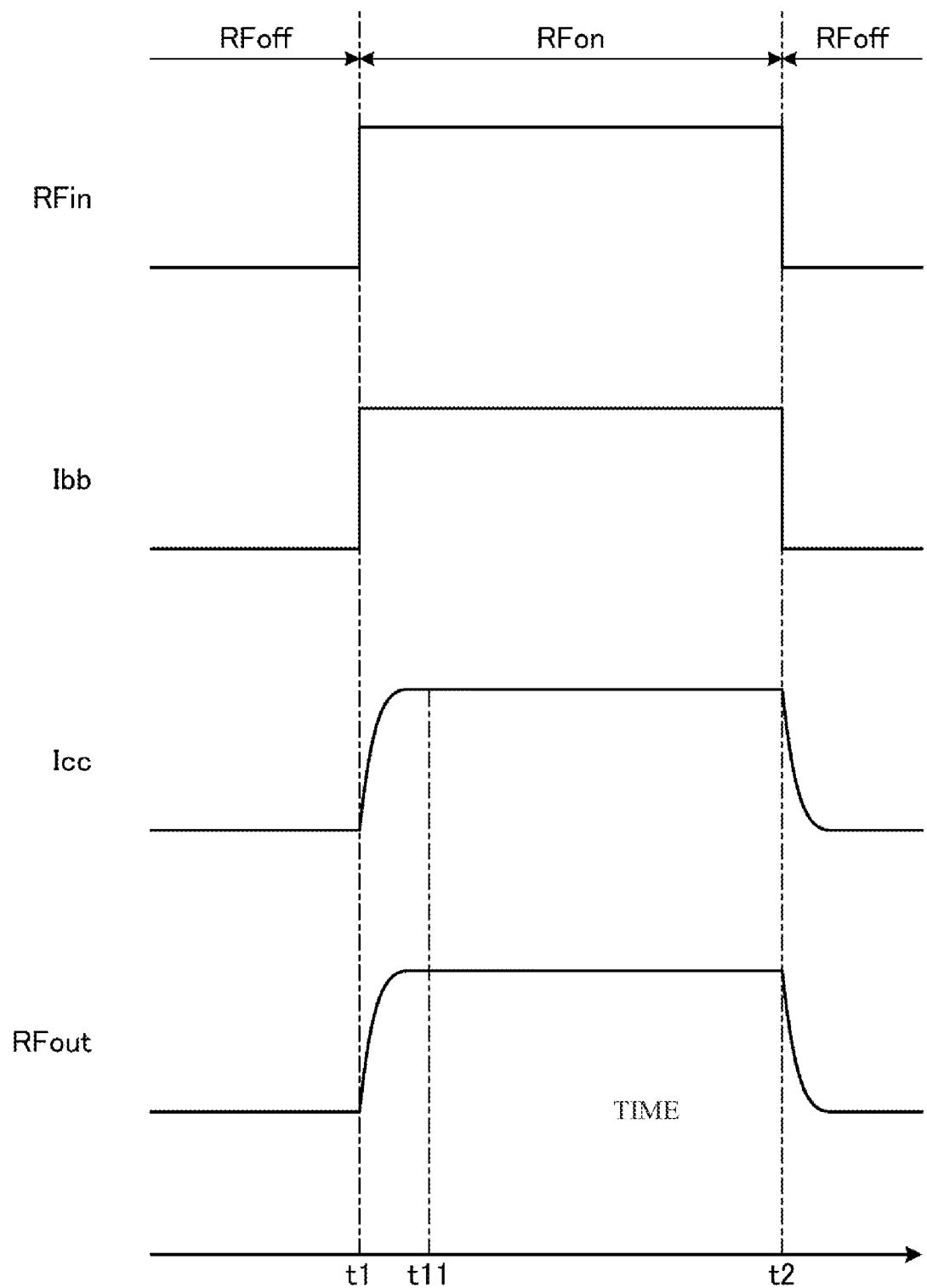
FIG. 3A illustrates an example of a timing chart of the power amplifier circuit according to the comparative example.
Figure 3B:
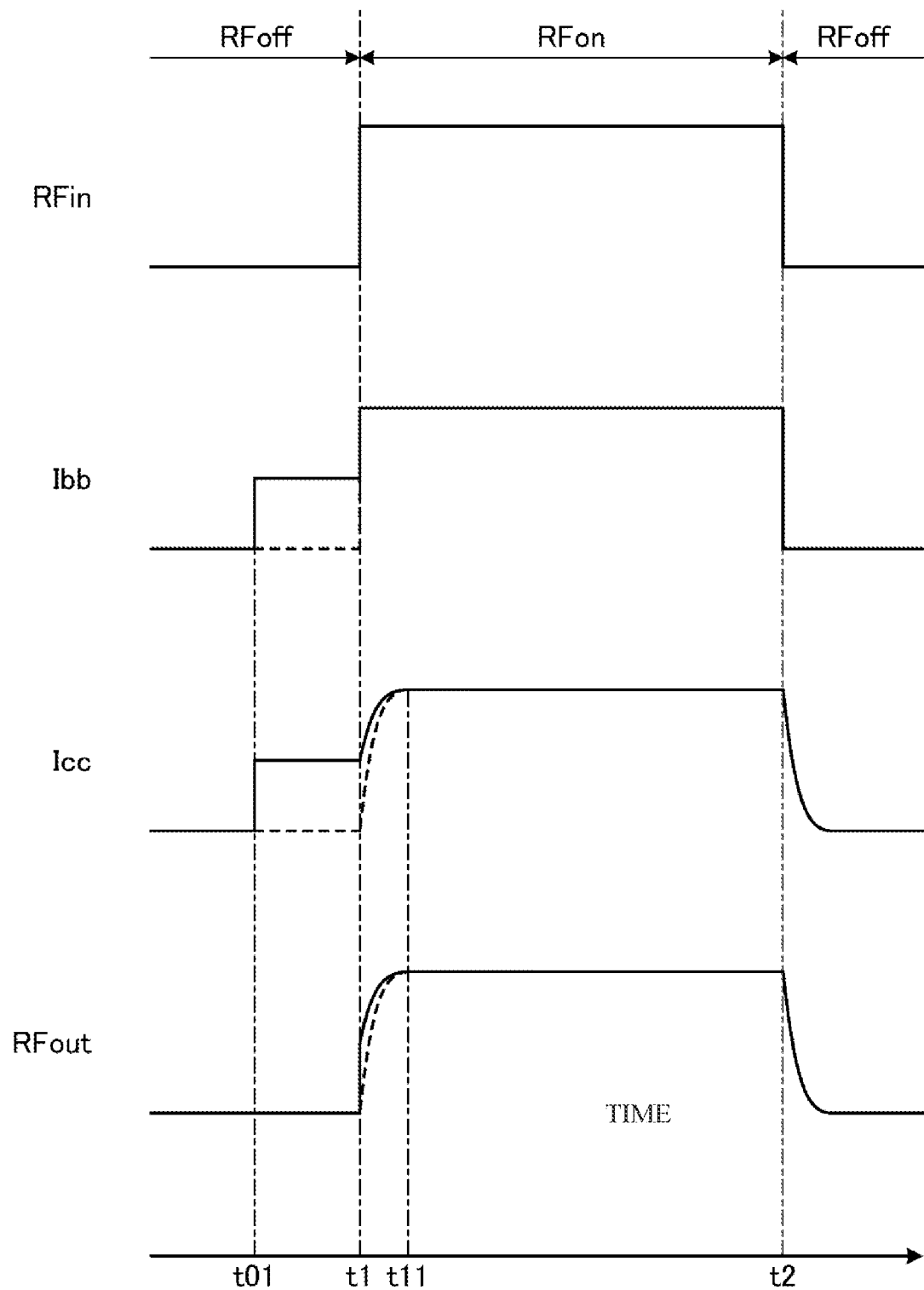
FIG. 3B illustrates an example of a timing chart of the power amplifier circuit according to the comparative example.

FIG. 2 illustrates an example of a configuration of a power amplifier circuit according to a comparative example. FIGS. 3A and 3B illustrate examples of timing charts of the power amplifier circuit according to the comparative example. In a power amplifier circuit 10 according to the comparative example illustrated in FIG. 2, a bias circuit 30 does not include the first switch circuit SW1, the second switch circuit SW2, the fourth switch circuit SW4, the first capacitor C1, and the second capacitor C2 that are included in the power amplifier circuit 1 according to Embodiment 1 illustrated in FIG. 1.

In FIGS. 3A and 3B, an RFon period from a time t1 to a time t2 corresponds to a transmission period in the TDD. That is, the RFon period is an amplification period during which the input signal RFin is amplified by the amplifier transistor Tr1. Furthermore, an RFoff period is an amplification operation suspension period during which the amplifier transistor Tr1 is not performing an operation of amplifying the input signal RFin. The RFon period varies according to subcarrier spacing SCS and is, for example, about 0.5 ms. The RFon period is composed of, for example, 14 orthogonal frequency division multiple access (OFDMA) symbols. In this RFon period, the input signal RFin is input.

In an example illustrated in FIG. 3A, when the third switch circuit SW3 is controlled to be turned on by a first control signal Cont1 at the start time t1 of the RFon period, the bias current Ibb is supplied to the base of the amplifier transistor Tr1. That is, the amplifier transistor Tr1 starts the operation of amplifying the input signal RFin at the start time t1 of the RFon period. Incidentally, in the comparative example illustrated in FIG. 2, the third switch circuit SW3 does not necessarily have to be provided. In a configuration in which no third switch circuit SW3 is provided, a form may be provided in which, when supply of the bias control current Icont from the current source is started at the start time t1 of the RFon period, the bias current Ibb is supplied to the base of the amplifier transistor Tr1.

When the amplifier transistor Tr1 starts the operation of amplifying the input signal RFin at the start time t1 of the RFon period, the temperature of the amplifier transistor Tr1 increases to result in a change in hFE. Specifically, when the temperature is relatively low, the hFE is high. When the temperature is relatively high, the hFE is low. This allows a collector current Icc of the amplifier transistor Tr1 to gradually flow more easily in response to an increase in temperature from a point in time when the amplification operation is started at the start time t1 of the RFon period. Hence, the temperature of the amplifier transistor Tr1 is relatively low immediately after the amplification operation is started (in the example illustrated in FIG. 3A, in a period from the start time t1 of the RFon period to a time t11 when the temperature of the amplifier transistor Tr1 reaches an equilibrium state), and there is a possibility that the EVM of the output signal RFout may deteriorate.

For example, in the RFoff period, that is, in the amplification operation suspension period of the amplifier transistor Tr1, the bias current Ibb is caused to flow to the base of the amplifier transistor Tr1 to bring the amplifier transistor Tr1 into an operating state and preheat the amplifier transistor Tr1, thereby making it possible to reduce the deterioration of the EVM immediately after the amplification operation is started. Specifically, as illustrated in FIG. 3B, for example, assuming that a period from a time t01 prior to the start time t1 of the RFon period to the start time t1 of the RFon period is a preheating period of the amplifier transistor Tr1, the bias current Ibb for preheating is caused to flow. This can make the period from the start time t1 of the RFon period to the time t11 when the temperature of the amplifier transistor Tr1 reaches an equilibrium state shorter than the example illustrated in FIG. 3A (dashed lines illustrated in FIG. 3B), and thus the deterioration of the EVM is reduced.

In the TDD in the fifth generation mobile communication system, the length of the preheating period from the preheating start time t01 illustrated in FIG. 3B to the start time t1 of the RFon period is limited. For example, when the preheating period from the preheating start time t01 to the start time t1 of the RFon period is about 3 μsec to about 5 μsec, there is a possibility that the effect of an improvement in EVM is not obtained.

Figure 4:
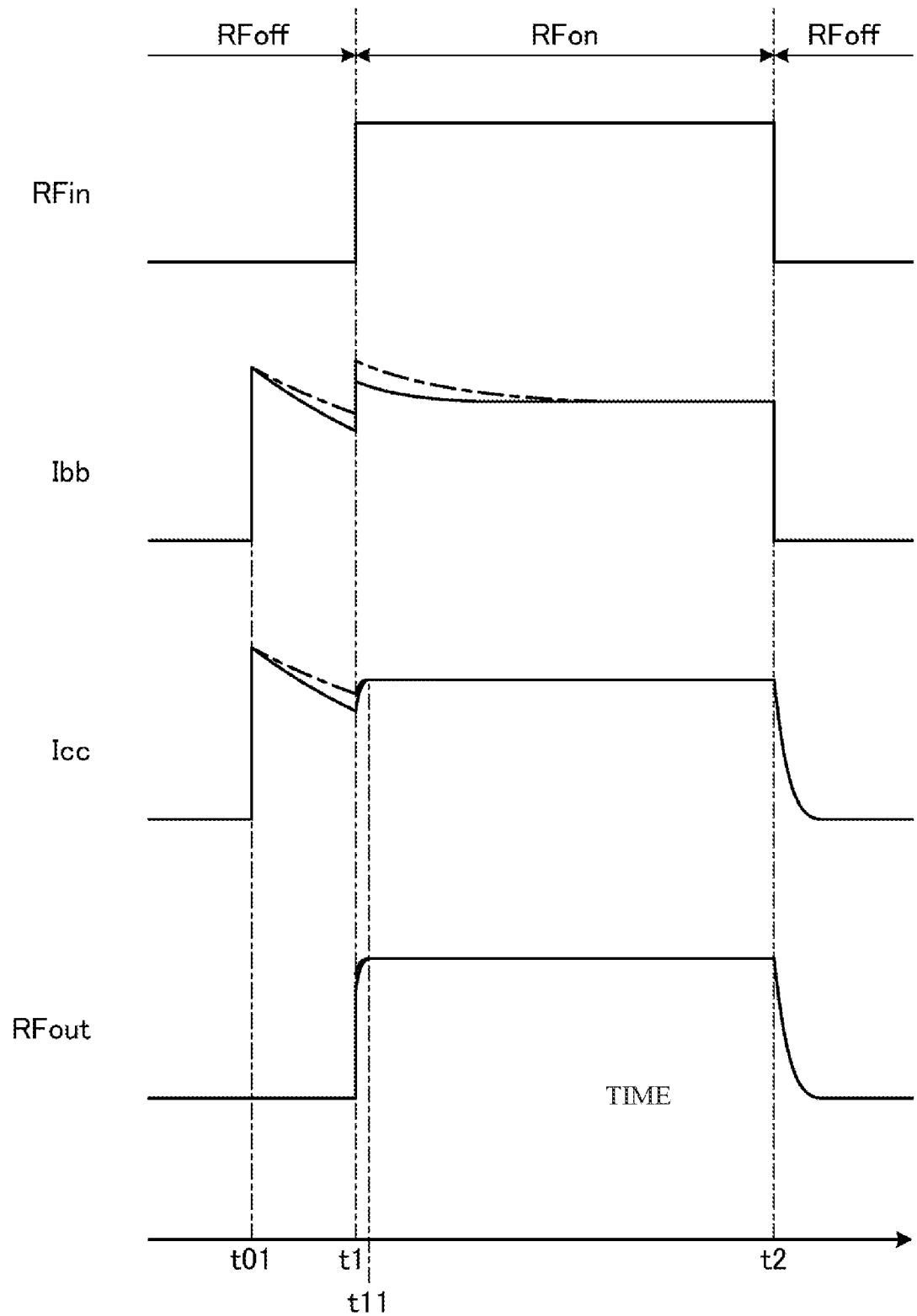
FIG. 4 illustrates an example of a timing chart of the power amplifier circuit according to Embodiment 1.

FIG. 4 illustrates an example of a timing chart of the power amplifier circuit according to Embodiment 1. In the power amplifier circuit 1 according to Embodiment 1 (see FIG. 1), in the RFoff period, the first switch circuit SW1 and the third switch circuit SW3 are controlled to be turned off by the first control signal Cont1, and the second switch circuit SW2 is controlled to be turned on by a second control signal Cont2.

Over the preheating period of the amplifier transistor Tr1 and the amplification period (RFon period) during which the input signal RFin is amplified by the amplifier transistor Tr1, the bias current Ibb is supplied. In the present disclosure, a period including the preheating period of the amplifier transistor Tr1 and the amplification period during which the input signal RFin is amplified by the amplifier transistor Tr1 is also referred to as "supply period during which the bias current Ibb is supplied". Furthermore, a period in which the preheating period of the amplifier transistor Tr1 is excluded from the amplification operation suspension period (RFoff period) during which the amplifier transistor Tr1 is not performing the operation of amplifying the input signal RFin is also referred to as "non-supply period during which the bias current Ibb is not supplied".

In the power amplifier circuit 1 according to this embodiment, for example, when the temperature of the amplifier transistor Tr1 is not less than a predetermined threshold value, the fourth switch circuit SW4 is controlled to be turned off by a third control signal Cont3.

Furthermore, when the temperature of the amplifier transistor Tr1 is less than the predetermined threshold value, the fourth switch circuit SW4 is controlled to be turned on. Hence, when the temperature of the amplifier transistor Tr1 is not less than the predetermined threshold value, the first capacitor C1 is charged in the non-supply period during which the bias current Ibb is not supplied. When the temperature of the amplifier transistor Tr1 is less than the predetermined threshold value, the first capacitor C1 and the second capacitor C2 are charged in the non-supply period during which the bias current Ibb is not supplied. A form may be provided in which the temperature of the amplifier transistor Tr1 is detected by a thermistor provided, for example, on a die of a semiconductor device constituting an IC or module where the amplifier transistor Tr1 is provided.

At the time t01 in the RFoff period, the first switch circuit SW1 and the third switch circuit SW3 are controlled to be turned on by the first control signal Cont1, and the second switch circuit SW2 is controlled to be turned off by the second control signal Cont2. Thus, electric charge with which the first capacitor C1 or the first capacitor C1 and the second capacitor C2 have been charged is discharged and superimposed on the bias current Ibb. As a result, the bias current Ibb that is larger than that in the form of the comparative example illustrated in FIG. 3B is supplied to the base of the amplifier transistor Tr1 to make it possible to efficiently preheat the amplifier transistor Tr1. Thus, the rising edge of the output signal RFout becomes steeper than that in the form of the comparative example illustrated in FIG. 3B, and the period to the time t11 when the temperature of the amplifier transistor Tr1 reaches an equilibrium state can be shortened, therefore enabling an increase in the effect of an improvement in EVM.

As illustrated in FIG. 4, solid lines denote the bias current Ibb, the collector current Icc of the amplifier transistor Tr1, and the output signal RFout that are exhibited when the temperature of the amplifier transistor Tr1 is not less than the predetermined threshold value, that is, when the fourth switch circuit SW4 is controlled to be turned off and only the first capacitor C1 is charged in the non-supply period during which the bias current Ibb is not supplied. Dashed lines denote the bias current Ibb, the collector current Icc of the amplifier transistor Tr1, and the output signal RFout that are exhibited when the temperature of the amplifier transistor Tr1 is less than the predetermined threshold value, that is, when the fourth switch circuit SW4 is controlled to be turned on and the first capacitor C1 and the second capacitor C2 are charged in the non-supply period during which the bias current Ibb is not supplied.

In this embodiment, when the temperature of the amplifier transistor Tr1 is less than the predetermined threshold value, the first capacitor C1 and the second capacitor C2 are charged in the non-supply period during which the bias current Ibb is not supplied. Thus, as illustrated in FIG. 4, discharge characteristics of the first capacitor C1 and the second capacitor C2 become moderate in comparison with those exhibited when the temperature of the amplifier transistor Tr1 is not less than the predetermined threshold value, enabling an increase in the effect of an improvement in EVM even if the temperature of the amplifier transistor Tr1 is relatively low.

Incidentally, although FIG. 1 illustrates the example of the configuration in which one second capacitor C2 is provided, the number of second capacitors C2 may be two or more. Furthermore, a form may be provided in which fourth switch circuits SW4 that can disconnect a plurality of second capacitors C2 are provided for the plurality of respective second capacitors C2. Additionally, in this case, a form may be provided in which, when a plurality of threshold values are set for the temperature of the amplifier transistor Tr1, the plurality of fourth switch circuits SW4 are controlled to be turned on/off in accordance with the different respective threshold values.

Furthermore, the second bias power supply potential Vb2 may be equal to the first bias power supply potential Vb1, or the first bias power supply potential Vb1 and the second bias power supply potential Vb2 may be different from each other. When the second bias power supply potential Vb2 is made relatively high, the effect of an improvement in EVM can be further increased. Hence, it is desirable that the second bias power supply potential Vb2 be higher than the first bias power supply potential Vb1.

First Modification

Figure 5:
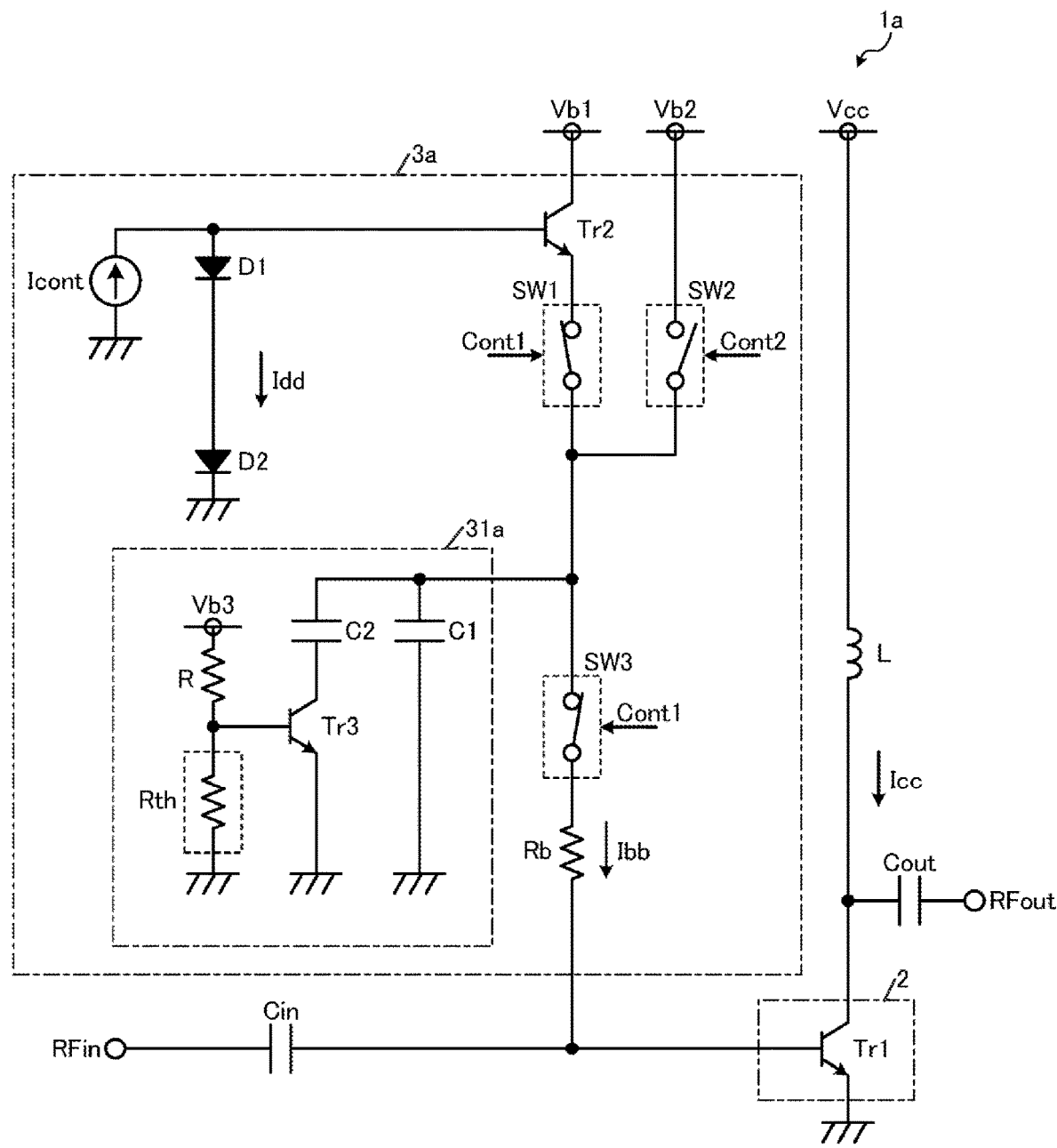
FIG. 5 illustrates an example of a configuration of a power amplifier circuit according to a first modification of Embodiment 1.

FIG. 5 illustrates an example of a configuration of a power amplifier circuit according to a first modification of Embodiment 1. In a bias circuit 3a of a power amplifier circuit 1a according to the first modification of Embodiment 1 illustrated in FIG. 5, an electrostatic capacity circuit 31a is provided. To implement a configuration in which the second capacitor C2 is able to be disconnected, the electrostatic capacity circuit 31a includes a switch transistor Tr3, a resistor R, and a thermistor Rth. The resistor R and the thermistor Rth are connected in series between a third bias power supply potential Vb3 and the reference potential (ground potential). A potential of a connection point between the resistor R and the thermistor Rth is connected to a base of the switch transistor Tr3 inserted in series with the second capacitor C2.

In the configuration illustrated in FIG. 5, the thermistor Rth is provided, for example, on a die of a semiconductor device constituting the IC or module where the amplifier transistor Tr1 is provided. The thermistor Rth has temperature characteristics in which the resistance value thereof varies according to temperature. The resistance value is relatively high at a relatively low temperature, and the resistance value is relatively low at a relatively high temperature. In this configuration, the switch transistor Tr3 is controlled to be turned on/off in accordance with a resistance ratio between the resistor R and the thermistor Rth. Specifically, when the temperature relatively decreases and the potential of the connection point between the resistor R and the thermistor Rth exceeds a Vbe of the switch transistor Tr3, the switch transistor Tr3 is controlled to be turned on. When the temperature relatively increases and the potential of the connection point between the resistor R and the thermistor Rth falls below the Vbe of the switch transistor Tr3, the switch transistor Tr3 is controlled to be turned off.

Second Modification

Figure 6:
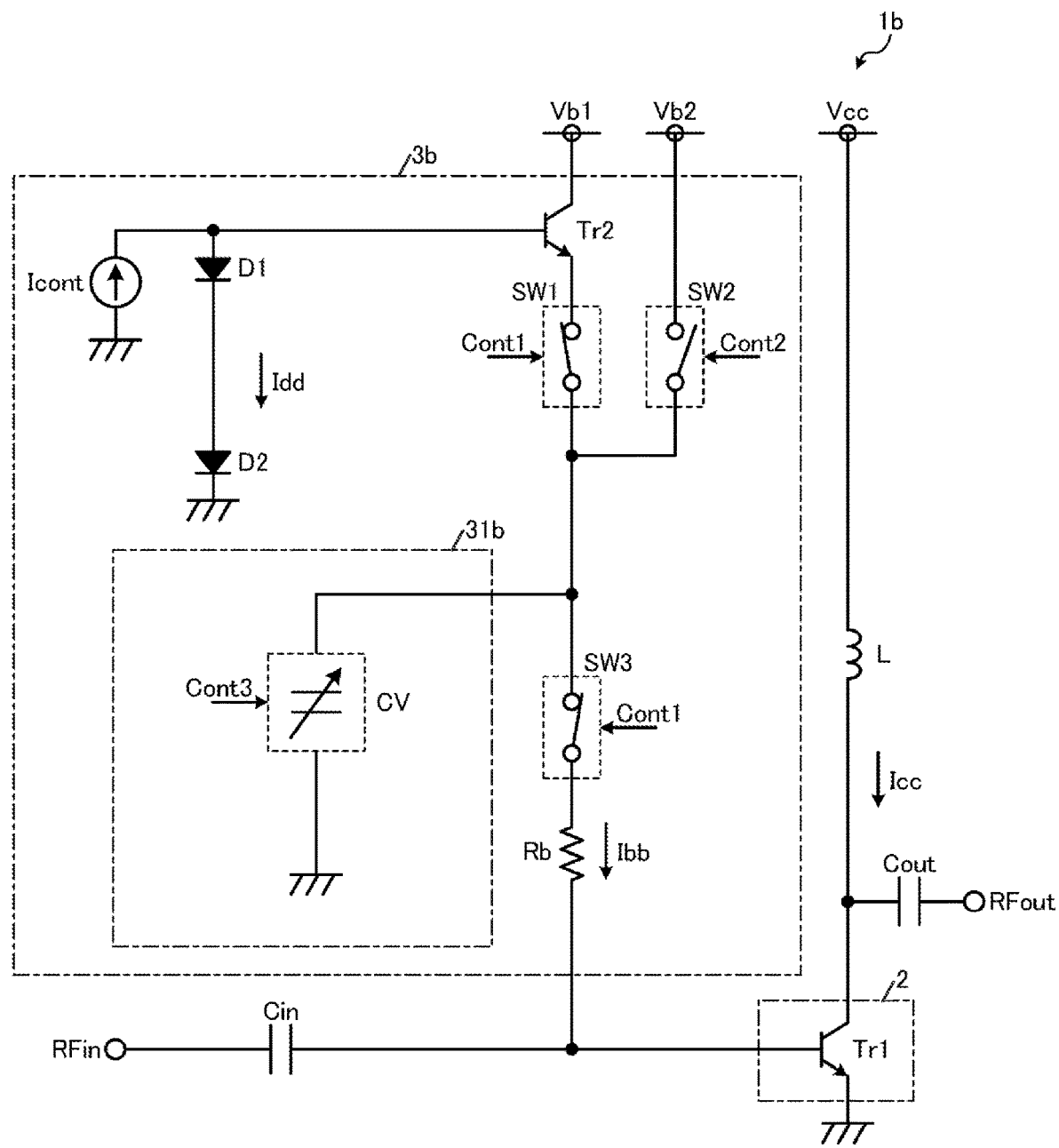
FIG. 6 illustrates an example of a configuration of a power amplifier circuit according to a second modification of Embodiment 1.

FIG. 6 illustrates an example of a configuration of a power amplifier circuit according to a second modification of Embodiment 1. In a bias circuit 3b of a power amplifier circuit 1b according to the second modification of Embodiment 1 illustrated in FIG. 6, an electrostatic capacity circuit 31b includes, in place of the first capacitor C1 and the second capacitor C2, a variable capacitor CV whose capacitance value varies in accordance with the third control signal Cont3.

In this configuration, the third control signal Cont3 may be a binary voltage signal or may be a voltage signal with three or more levels. When the third control signal Cont3 is a voltage signal with three or more levels, the capacitance value of the variable capacitor CV can be flexibly set. Specifically, when the capacitance value of the CV is caused to vary in accordance with a change in temperature, the optimum effect of an improvement in EVM based on a change in temperature can be obtained.

Furthermore, when a configuration is provided in which the resistor R and the thermistor Rth are included as in the first modification of Embodiment 1, the optimum effect of an improvement in EVM based on a change in temperature can be obtained by using a non-stepwise change in the resistance ratio between the resistor R and the thermistor Rth.

Embodiment 2

Figure 7:
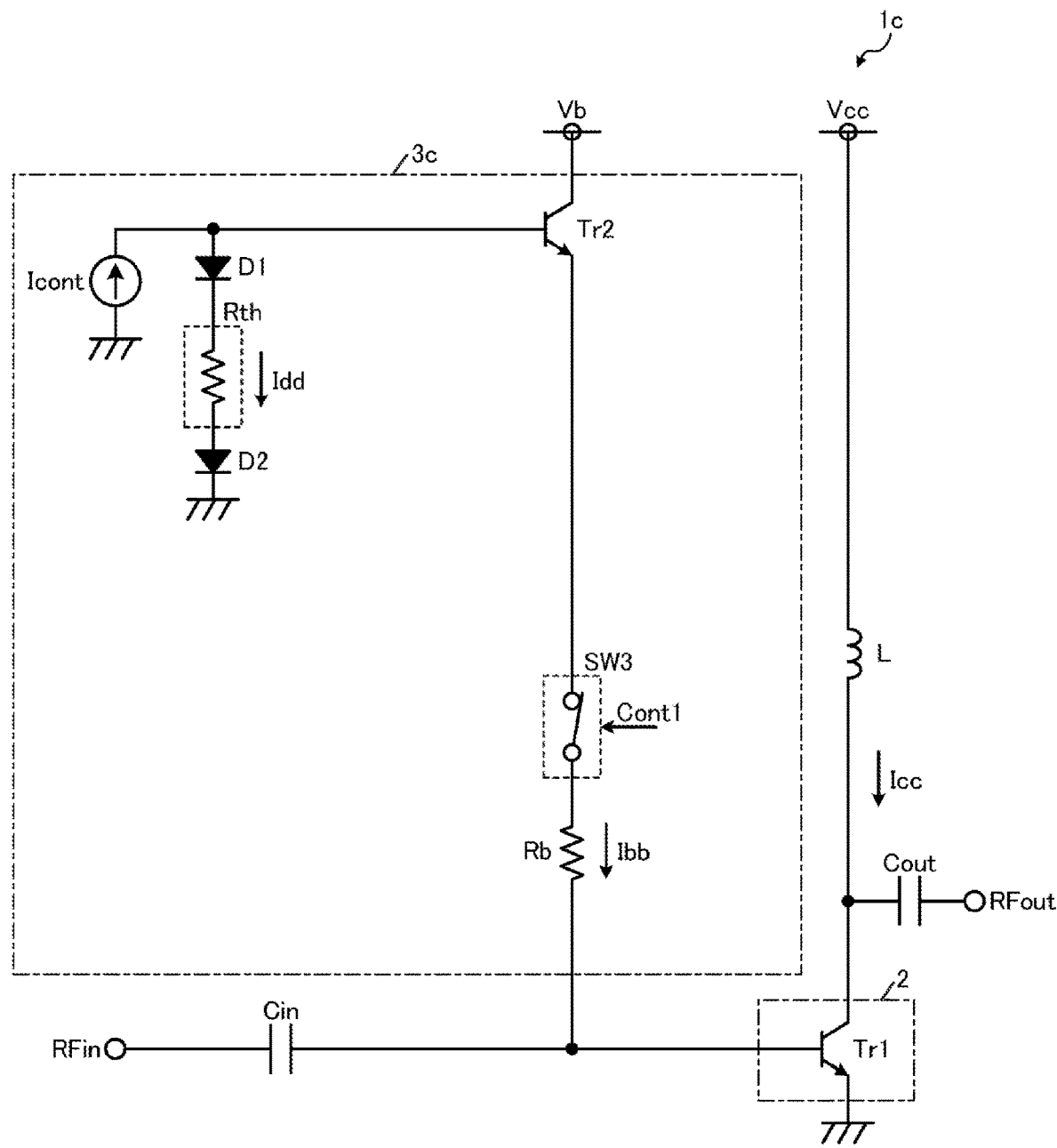
FIG. 7 illustrates an example of a configuration of a power amplifier circuit according to Embodiment 2.

FIG. 7 illustrates an example of a configuration of a power amplifier circuit according to Embodiment 2. In a bias circuit 3c of a power amplifier circuit 1c according to Embodiment 2 illustrated in FIG. 7, the emitter of the bias current supply transistor Tr2 is connected to the base of the amplifier transistor Tr1 through the third switch circuit SW3 and the resistor Rb. Furthermore, in this embodiment, in the bias circuit 3c, a first thermistor Rth1 is provided between the first diode D1 and the second diode D2.

In the configuration illustrated in FIG. 7, the first thermistor Rth1 is provided, for example, on a die of a semiconductor device constituting the IC or module where the amplifier transistor Tr1 is provided. Incidentally, the first thermistor Rth1 is not limited to the form in which the first thermistor Rth1 is provided between the first diode D1 and the second diode D2. The first thermistor Rth1 may be connected to the anode of the first diode D1 or may be connected to the cathode of the second diode D2.

Figure 8:
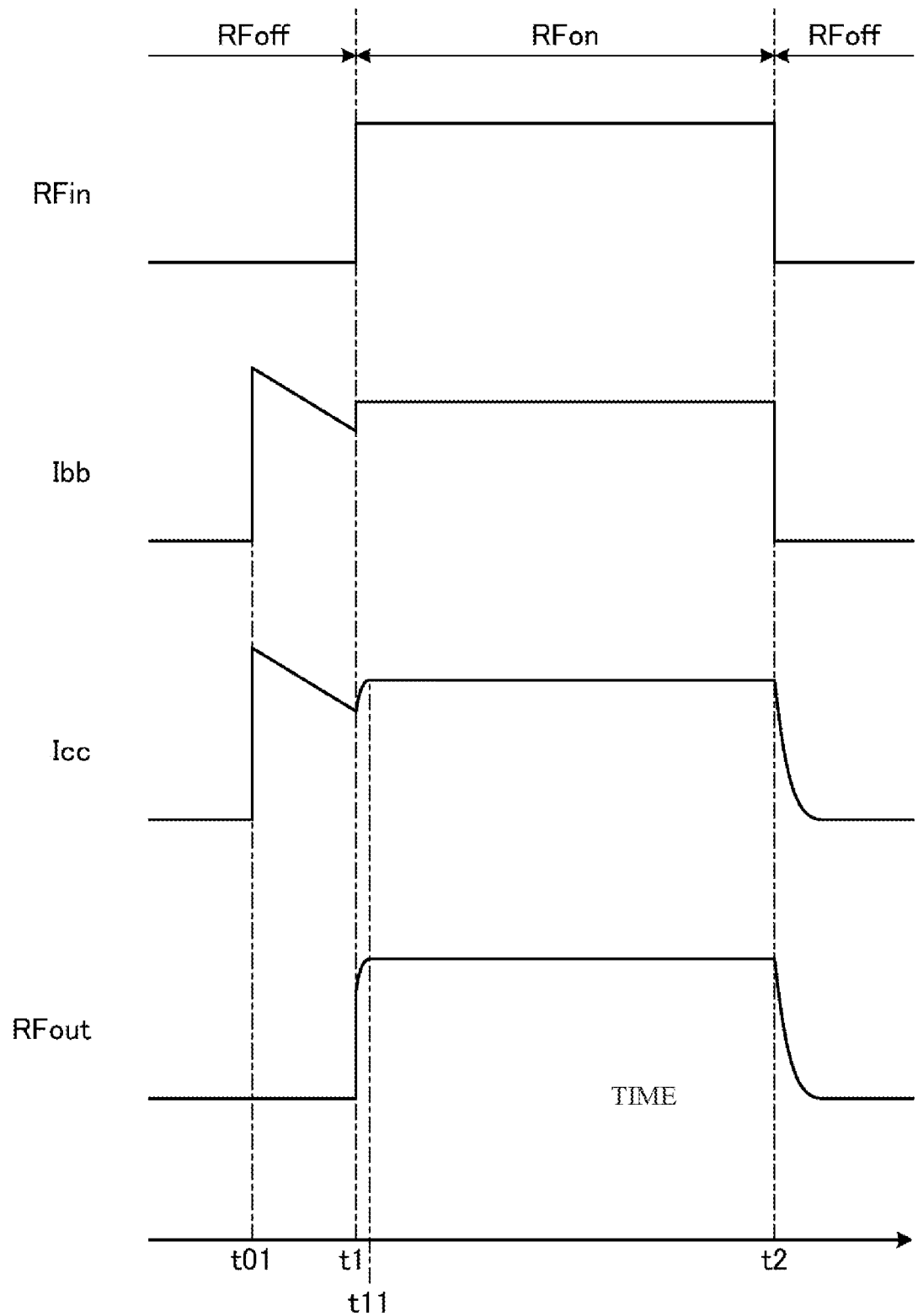
FIG. 8 illustrates an example of a timing chart of the power amplifier circuit according to Embodiment 2.

FIG. 8 illustrates an example of a timing chart of the power amplifier circuit according to Embodiment 2. In the power amplifier circuit 1c according to Embodiment 2, at the time t01 in the RFoff period, the third switch circuit SW3 is controlled to be turned on by the first control signal Cont1. Thus, the current Idd based on a resistance value of the first thermistor Rth1 flows, and the bias current Ibb is supplied to the base of the amplifier transistor Tr1. Consequently, preheating of the amplifier transistor Tr1 is started.

In the configuration according to Embodiment 2, the first thermistor Rth1 is provided, and thus, in the preheating period from the preheating start time t01 to the start time t1 of the RFon period, the bias current Ibb that is larger than that in the form of the comparative example illustrated in FIG. 3B is supplied to the base of the amplifier transistor Tr1 to make it possible to efficiently preheat the amplifier transistor Tr1.

Furthermore, in the preheating period from the preheating start time t01 to the start time t1 of the RFon period, the resistance value of the first thermistor Rth1 decreases as the temperature of the amplifier transistor Tr1 increases. This can make the period to the time t11 when the temperature of the amplifier transistor Tr1 reaches an equilibrium state shorter than that in the form of the comparative example illustrated in FIG. 3B, enabling an increase in the effect of an improvement in EVM.

Embodiment 3

Figure 9:
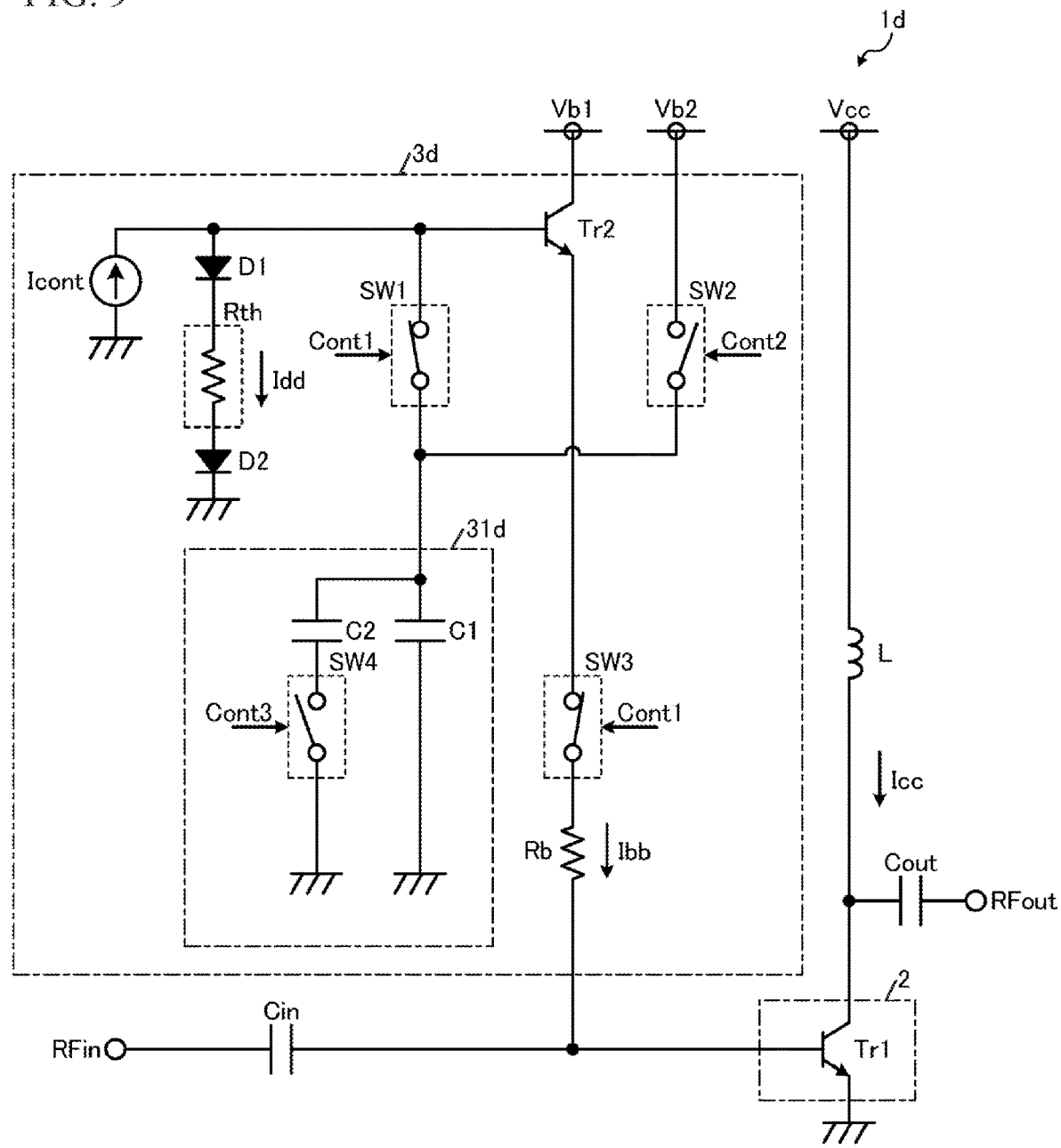
FIG. 9 illustrates an example of a configuration of a power amplifier circuit according to Embodiment 3.

FIG. 9 illustrates an example of a configuration of a power amplifier circuit according to Embodiment 3. In a bias circuit 3d of a power amplifier circuit 1d according to Embodiment 3 illustrated in FIG. 9, the emitter of bias current supply transistor Tr2 is connected to the base of the amplifier transistor Tr1 through the third switch circuit SW3 and the resistor Rb. Furthermore, in this embodiment, in the bias circuit 3d, the first thermistor Rth1 is provided between the first diode D1 and the second diode D2 as in the configuration according to Embodiment 2. The first thermistor Rth1 is provided, for example, on a die of a semiconductor device constituting the IC or module where the amplifier transistor Tr1 is provided. Incidentally, the first thermistor Rth1 is not limited to the form in which the first thermistor Rth1 is provided between the first diode D1 and the second diode D2. The first thermistor Rth1 may be connected to the anode of the first diode D1 or may be connected to the cathode of the second diode D2.

Furthermore, in the bias circuit 3d, an electrostatic capacity circuit 31d is provided between the connection point of the anode of the first diode D1 and the base of the bias current supply transistor Tr2 and the reference potential (ground potential here). In the electrostatic capacity circuit 31d, the first capacitor C1 and the second capacitor C2 are connected in parallel through the first switch circuit SW1. The second capacitor C2 is provided so as to be able to be disconnected by the fourth switch circuit SW4.

Furthermore, in this embodiment, in the bias circuit 3d, the second switch circuit SW2 that enables supply of the second bias power supply potential Vb2 is provided at a connection point of the first switch circuit SW1, the first capacitor C1, and the second capacitor C2.

Figure 10:
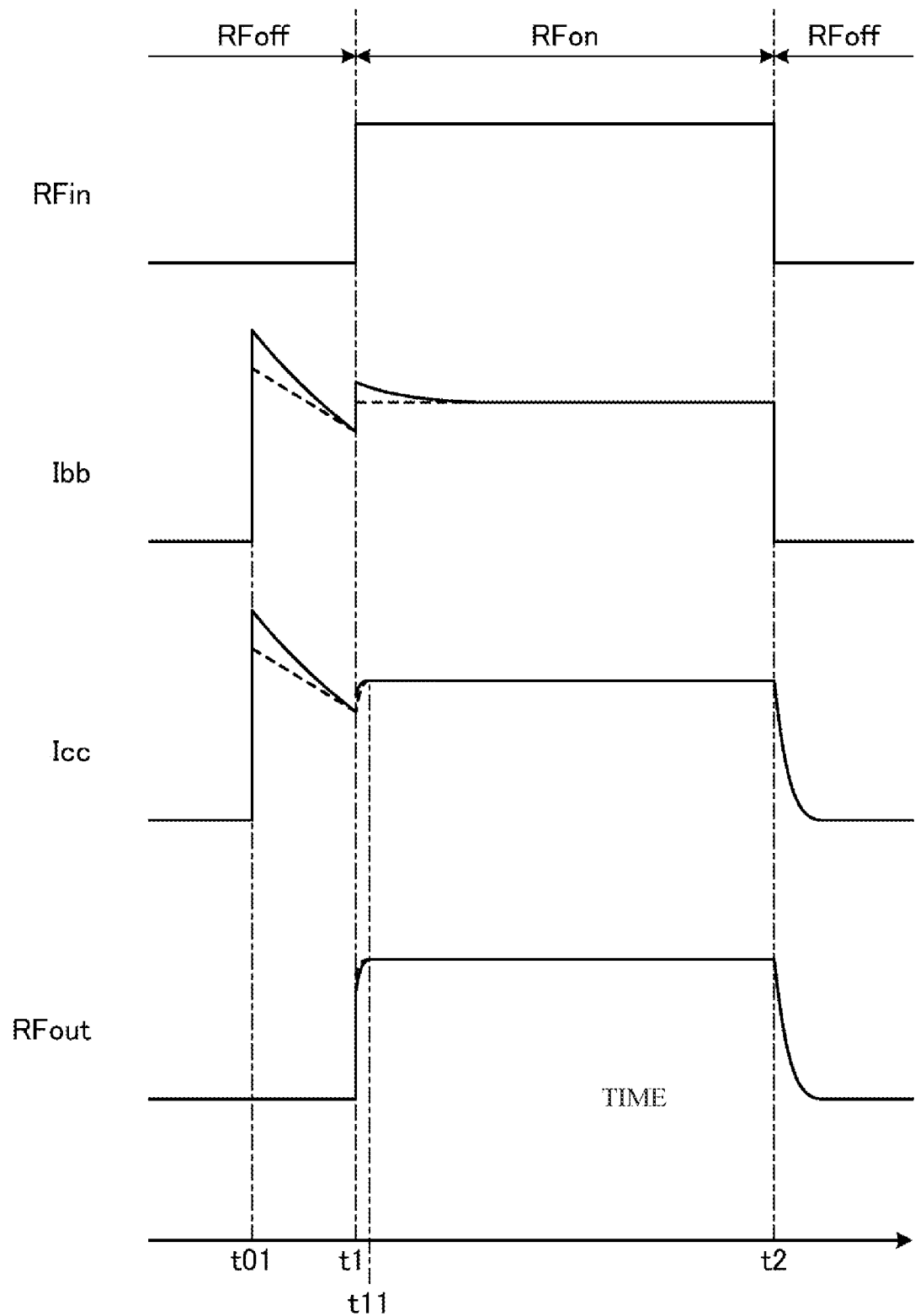
FIG. 10 illustrates an example of a timing chart of the power amplifier circuit according to Embodiment 3.

FIG. 10 illustrates an example of a timing chart of the power amplifier circuit according to Embodiment 3. In the power amplifier circuit 1d according to Embodiment 3, in the RFoff period, the first switch circuit SW1 and the third switch circuit SW3 are controlled to be turned off by the first control signal Cont1, and the second switch circuit SW2 is controlled to be turned on by the second control signal Cont2.

In the power amplifier circuit 1d according to this embodiment, for example, when the temperature of the amplifier transistor Tr1 is not less than the predetermined threshold value, the fourth switch circuit SW4 is controlled to be turned off by the third control signal Cont3. When the temperature of the amplifier transistor Tr1 is less than the predetermined threshold value, the fourth switch circuit SW4 is controlled to be turned on. Hence, when the temperature of the amplifier transistor Tr1 is not less than the predetermined threshold value, the first capacitor C1 is charged in the non-supply period during which the bias current Ibb is not supplied. When the temperature of the amplifier transistor Tr1 is less than the predetermined threshold value, the first capacitor C1 and the second capacitor C2 are charged in the non-supply period during which the bias current Ibb is not supplied. A form may be provided in which the temperature of the amplifier transistor Tr1 is detected by a thermistor provided, for example, on a die of a semiconductor device constituting the IC or module where the amplifier transistor Tr1 is provided.

In the configuration according to Embodiment 3, the first thermistor Rth1 is provided, and thus, in the preheating period from the preheating start time t01 to the start time t1 of the RFon period, the bias current Ibb that is larger than that in the form of the comparative example illustrated in FIG. 3B is supplied to the base of the amplifier transistor Tr1 as in Embodiment 2.

Furthermore, at the time t01 in the RFoff period, the first switch circuit SW1 and the third switch circuit SW3 are controlled to be turned on by the first control signal Cont1, and the second switch circuit SW2 is controlled to be turned off by the second control signal Cont2. Thus, electric charge with which the first capacitor C1 or the first capacitor C1 and the second capacitor C2 have been charged is discharged and superimposed on the bias current Ibb. As a result, the bias current Ibb that is larger than that in the form of Embodiment 2 illustrated in FIG. 8 (a dashed line in FIG. 10) is supplied to the base of the amplifier transistor Tr1 to make it possible to promote preheating of the amplifier transistor Tr1.

First Modification

Figure 11:
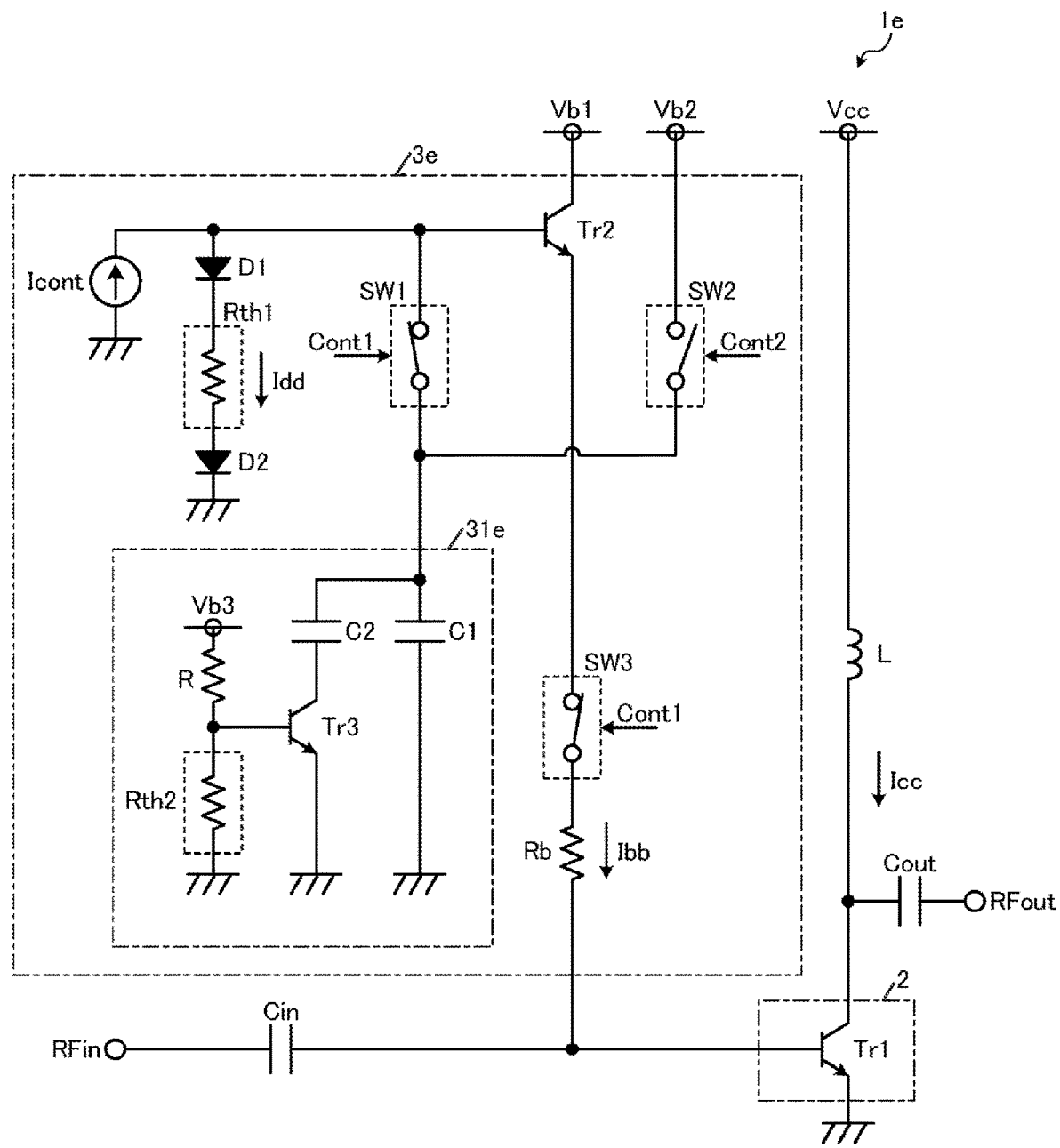
FIG. 11 illustrates an example of a configuration of a power amplifier circuit according to a first modification of Embodiment 3.

FIG. 11 illustrates an example of a configuration of a power amplifier circuit according to a first modification of Embodiment 3. In a bias circuit 3e of a power amplifier circuit 1e according to the first modification of Embodiment 3 illustrated in FIG. 11, an electrostatic capacity circuit 31e is provided. As in the first modification of Embodiment 1, to implement a configuration in which the second capacitor C2 is able to be disconnected, the electrostatic capacity circuit 31e includes the switch transistor Tr3, the resistor R, and a second thermistor Rth2. The resistor R and the second thermistor Rth2 are connected in series between the third bias power supply potential Vb3 and the reference potential (ground potential). A potential of a connection point between the resistor R and the second thermistor Rth2 is connected to the base of the switch transistor Tr3 inserted in series with the second capacitor C2.

In the configuration illustrated in FIG. 11, the second thermistor Rth2 is provided, for example, on a die of a semiconductor device constituting the IC or module where the amplifier transistor Tr1 is provided. The second thermistor Rth2 has temperature characteristics in which the resistance value thereof varies according to temperature. The resistance value is relatively high at a relatively low temperature, and the resistance value is relatively low at a relatively high temperature. In this configuration, the switch transistor Tr3 is controlled to be turned on/off in accordance with a resistance ratio between the resistor R and the second thermistor Rth2. Specifically, when the temperature relatively decreases and the potential of the connection point between the resistor R and the second thermistor Rth2 exceeds the Vbe of the switch transistor Tr3, the switch transistor Tr3 is controlled to be turned on. When the temperature relatively increases and the potential of the connection point between the resistor R and the second thermistor Rth2 falls below the Vbe of the switch transistor Tr3, the switch transistor Tr3 is controlled to be turned off.

Second Modification

Figure 12:
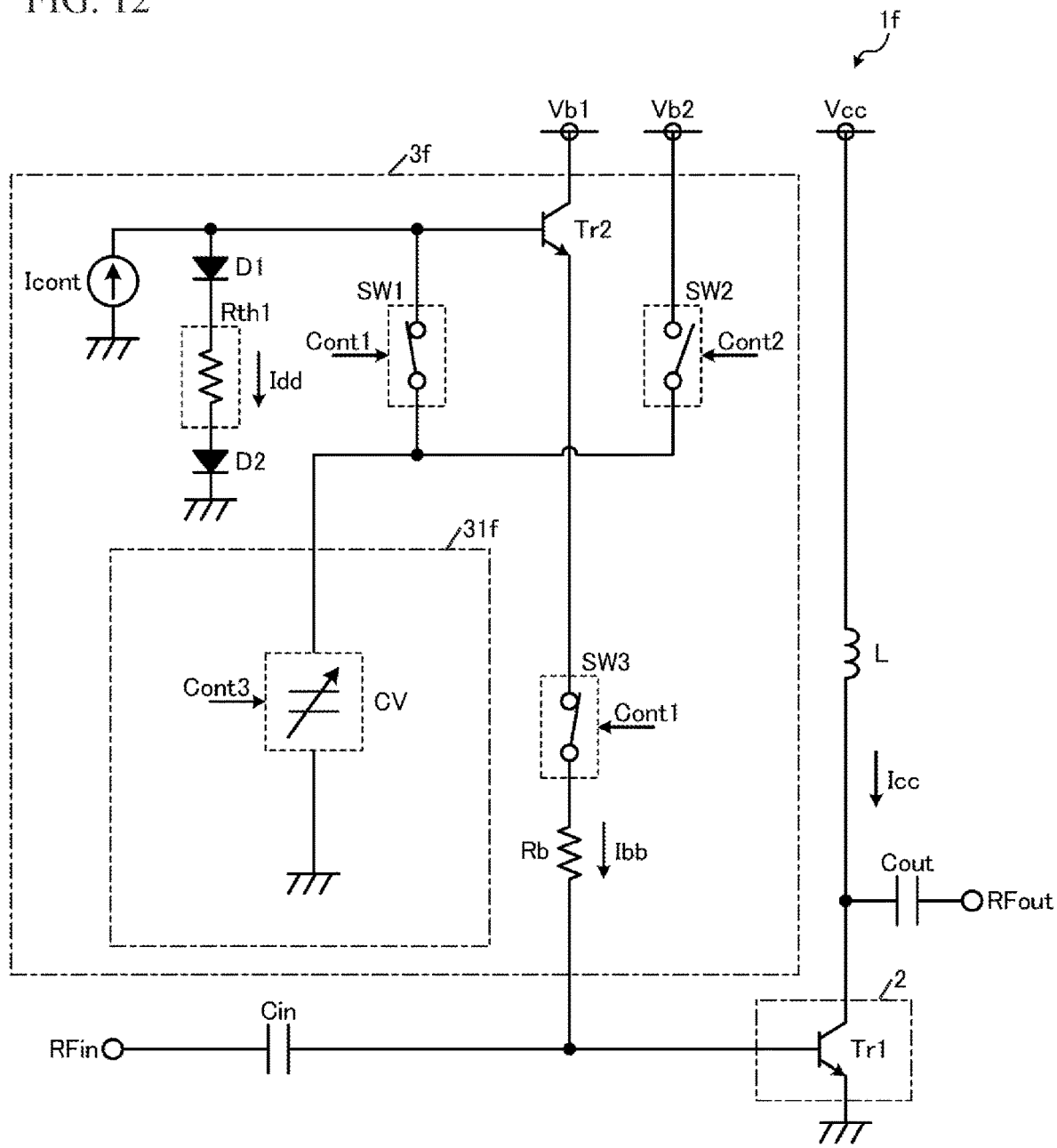
FIG. 12 illustrates an example of a configuration of a power amplifier circuit according to a second modification of Embodiment 3.

FIG. 12 illustrates an example of a configuration of a power amplifier circuit according to a second modification of Embodiment 3. In a bias circuit 3f of a power amplifier circuit if according to the second modification of Embodiment 3 illustrated in FIG. 12, as in the second modification of Embodiment 1, an electrostatic capacity circuit 31f includes, in place of the first capacitor C1 and the second capacitor C2, the variable capacitor CV whose capacitance value varies in accordance with the third control signal Cont3.

In this configuration, the third control signal Cont3 may be a binary voltage signal or may be a voltage signal with three or more levels. When the third control signal Cont3 is a voltage signal with three or more levels, the capacitance value of the variable capacitor CV can be flexibly set. Specifically, when the capacitance value of the CV is caused to vary in accordance with a change in temperature, the optimum effect of an improvement in EVM based on a change in temperature can be obtained.

Furthermore, when a configuration is provided in which the resistor R and the second thermistor Rth2 are included as in the first modification of Embodiment 3, the optimum effect of an improvement in EVM based on a change in temperature can be obtained by using a non-stepwise change in the resistance ratio between the resistor R and the second thermistor Rth2.

The above-described embodiments are intended to facilitate understanding of the present disclosure but are not intended for a limited interpretation of the present disclosure. The present disclosure can be changed or improved without departing from the gist thereof and also encompasses equivalents thereof.

The present disclosure is as described above, or may employ the following configurations in place of the above.

(1) A power amplifier circuit according to one aspect of the present disclosure includes an amplifier transistor configured to amplify a radio-frequency signal and output the radio-frequency signal, and a bias circuit configured to supply a bias current to a base of the amplifier transistor. The bias circuit includes a bias current supply transistor, and an electrostatic capacity circuit whose electrostatic capacity varies in accordance with a temperature of the amplifier transistor and that is configured to be charged in a non-supply period during which the bias current is not supplied and is configured to discharge to a supply path for the bias current in a supply period during which the bias current is supplied. The supply period during which the bias current is supplied includes an amplification period during which the radio-frequency signal is amplified by the amplifier transistor. The bias current starts to be supplied before the amplifier transistor starts amplification.

In this configuration, the amplifier transistor can be preheated in accordance with the temperature of the amplifier transistor before the amplifier transistor starts amplification of the radio-frequency signal. Thus, a period that elapses before the temperature of the amplifier transistor reaches an equilibrium state can be shortened regardless of the temperature of the amplifier transistor before the start of amplification, enabling an effective improvement in modulation accuracy.

(2) In the power amplifier circuit according to (1), the electrostatic capacity circuit includes a first capacitor provided between the supply path for the bias current and a reference potential, and a second capacitor configured to be connected in parallel with the first capacitor when the temperature of the amplifier transistor is less than a predetermined threshold value and configured to be disconnected from the first capacitor when the temperature of the amplifier transistor is not less than the predetermined threshold value.

In this configuration, when the temperature of the amplifier transistor is less than the predetermined threshold value, a capacitance value of the electrostatic capacity circuit is a resultant capacitance value of the first capacitor and the second capacitor. This enables an increase in the effect of an improvement in modulation accuracy even if the temperature of the amplifier transistor is relatively low.

(3) In the power amplifier circuit according to (1), the electrostatic capacity circuit includes a variable capacitor whose capacitance value varies in accordance with the temperature of the amplifier transistor.

In this configuration, the effect of an improvement in modulation accuracy can be optimized in accordance with a change in the temperature of the amplifier transistor.

(4) In the power amplifier circuit according to (2) or (3), the electrostatic capacity circuit includes a thermistor whose resistance value varies in accordance with the temperature of the amplifier transistor.

In this configuration, the effect of an improvement in modulation accuracy can be optimized by using a non-stepwise change in the resistance value of the thermistor based on the temperature of the amplifier transistor.

(5) A power amplifier circuit according to one aspect of the present disclosure includes an amplifier transistor configured to amplify a radio-frequency signal and output the radio-frequency signal, and a bias circuit configured to supply a bias current to a base of the amplifier transistor. The bias circuit includes a bias current supply transistor, a temperature compensation diode connected in series between a base of the bias current supply transistor and a reference potential, and a first thermistor whose resistance value varies in accordance with a temperature of the amplifier transistor and that is connected in series with the temperature compensation diode. A supply period during which the bias current is supplied includes an amplification period during which the radio-frequency signal is amplified by the amplifier transistor. The bias current starts to be supplied before the amplifier transistor starts amplification.

In this configuration, the amplifier transistor can be preheated in accordance with the temperature of the amplifier transistor before the amplifier transistor starts amplification of the radio-frequency signal. Thus, a period that elapses before the temperature of the amplifier transistor reaches an equilibrium state can be shortened regardless of the temperature of the amplifier transistor before the start of amplification, enabling an effective improvement in modulation accuracy.

(6) In the power amplifier circuit according to (5), the bias circuit further includes an electrostatic capacity circuit whose electrostatic capacity varies in accordance with the temperature of the amplifier transistor and that is configured to be charged in a non-supply period during which the bias current is not supplied and is configured to discharge to the base of the bias current supply transistor in the supply period during which the bias current is supplied.

In this configuration, the amplifier transistor can be preheated more efficiently.

(7) In the power amplifier circuit according to (6), the electrostatic capacity circuit includes a first capacitor provided between the base of the bias current supply transistor and the reference potential, and a second capacitor configured to be connected in parallel with the first capacitor when the temperature of the amplifier transistor is less than a predetermined threshold value and configured to be disconnected from the first capacitor when the temperature of the amplifier transistor is not less than the predetermined threshold value.

In this configuration, when the temperature of the amplifier transistor is less than the predetermined threshold value, a capacitance value of the electrostatic capacity circuit is a resultant capacitance value of the first capacitor and the second capacitor. This enables an increase in the effect of an improvement in modulation accuracy even if the temperature of the amplifier transistor is relatively low.

(8) In the power amplifier circuit according to (6), the electrostatic capacity circuit includes a variable capacitor whose capacitance value varies in accordance with the temperature of the amplifier transistor.

In this configuration, the effect of an improvement in modulation accuracy can be optimized in accordance with a change in the temperature of the amplifier transistor.

(9) In the power amplifier circuit according to (7) or (8), the electrostatic capacity circuit includes a second thermistor whose resistance value varies in accordance with the temperature of the amplifier transistor.

In this configuration, the effect of an improvement in modulation accuracy can be optimized by using a non-stepwise change in the resistance value of the second thermistor based on the temperature of the amplifier transistor.

(10) In the power amplifier circuit according to any one of (1) to (4) and (6) to (9), a power supply potential applied when the electrostatic capacity circuit is charged is higher than a power supply potential supplied to the bias current supply transistor.

In this configuration, the effect of an improvement in modulation accuracy can be further increased.

The present disclosure can implement the power amplifier circuit that enables an effective improvement in modulation accuracy.

What is claimed is:

1. A power amplifier circuit comprising:
an amplifier transistor configured to amplify a radio-frequency signal and to output an amplified radio-frequency signal; and
a bias circuit configured to supply a bias current to a base of the amplifier transistor, the bias circuit comprising:
    a bias current supply transistor, and
    an electrostatic capacity circuit whose electrostatic capacity varies in accordance with a temperature of the amplifier transistor, that is configured to charge during a non-supply period during which the bias current is not supplied, and that is configured to discharge to a bias current supply path during a supply period during which the bias current is supplied,
wherein the supply period during which the bias current is supplied includes an amplification period during which the radio-frequency signal is amplified by the amplifier transistor, and
wherein the supply period begins before the amplification period begins.

2. The power amplifier circuit according to claim 1, wherein the electrostatic capacity circuit comprises:
a first capacitor between the supply path for the bias current and a reference potential, and
a second capacitor configured to be connected in parallel with the first capacitor when the temperature of the amplifier transistor is less than a predetermined threshold value, and configured to be disconnected from the first capacitor when the temperature of the amplifier transistor is not less than the predetermined threshold value.

3. The power amplifier circuit according to claim 1, wherein the electrostatic capacity circuit comprises:
a variable capacitor whose capacitance value varies in accordance with the temperature of the amplifier transistor.

4. The power amplifier circuit according to claim 2, wherein the electrostatic capacity circuit comprises:
a thermistor whose resistance value varies in accordance with the temperature of the amplifier transistor.

5. The power amplifier circuit according to claim 3, wherein the electrostatic capacity circuit comprises:
a thermistor whose resistance value varies in accordance with the temperature of the amplifier transistor.

6. A power amplifier circuit comprising:
an amplifier transistor configured to amplify a radio-frequency signal and to output an amplified radio-frequency signal; and
a bias circuit configured to supply a bias current to a base of the amplifier transistor, the bias circuit comprising:
    a bias current supply transistor,
    a temperature compensation diode connected in series between a base of the bias current supply transistor and a reference potential, and
    a first thermistor whose resistance value varies in accordance with a temperature of the amplifier transistor, and that is connected in series with the temperature compensation diode,
wherein a supply period during which the bias current is supplied includes an amplification period during which the radio-frequency signal is amplified by the amplifier transistor, and
wherein the supply period begins before the amplification period begins.

7. The power amplifier circuit according to claim 6, wherein the bias circuit further comprises:
an electrostatic capacity circuit whose electrostatic capacity varies in accordance with the temperature of the amplifier transistor, that is configured to charge during a non-supply period during which the bias current is not supplied, and that is configured to discharge to the base of the bias current supply transistor during the supply period during which the bias current is supplied.

8. The power amplifier circuit according to claim 7, wherein the electrostatic capacity circuit comprises:
a first capacitor between the base of the bias current supply transistor and the reference potential, and
a second capacitor configured to be connected in parallel with the first capacitor when the temperature of the amplifier transistor is less than a predetermined threshold value, and configured to be disconnected from the first capacitor when the temperature of the amplifier transistor is not less than the predetermined threshold value.

9. The power amplifier circuit according to claim 7, wherein the electrostatic capacity circuit comprises:
a variable capacitor whose capacitance value varies in accordance with the temperature of the amplifier transistor.

10. The power amplifier circuit according to claim 8, wherein the electrostatic capacity circuit comprises:
   a second thermistor whose resistance value varies in accordance with the temperature of the amplifier transistor.

11. The power amplifier circuit according to claim 9, wherein the electrostatic capacity circuit comprises:
   a second thermistor whose resistance value varies in accordance with the temperature of the amplifier transistor.

12. The power amplifier circuit according to claim 1, wherein a power supply potential applied when the electrostatic capacity circuit is charged is greater than a power supply potential supplied to the bias current supply transistor.

13. The power amplifier circuit according to claim 7, wherein a power supply potential applied when the electrostatic capacity circuit is charged is greater than a power supply potential supplied to the bias current supply transistor.

\* \* \* \* \*

UNITED STATES PATENT AND TRADEMARK OFFICE
CERTIFICATE OF CORRECTION

PATENT NO. : 12,244,276 B2
APPLICATION NO. : 17/656284
DATED : March 4, 2025
INVENTOR(S) : Naofumi Takezono and Masashi Maruyama Page 1 of 1

It is certified that error appears in the above-identified patent and that said Letters Patent is hereby corrected as shown below:

In the Specification

Column 11, Line 10, "circuit if according to" should read --circuit 1f according to--.

Signed and Sealed this
Twenty-seventh Day of May, 2025

Coke Morgan Stewart
*Acting Director of the United States Patent and Trademark Office*